(12) United States Patent
Park et al.

(10) Patent No.: US 7,256,108 B2
(45) Date of Patent: Aug. 14, 2007

(54) METHOD FOR REDUCING SEMICONDUCTOR DIE WARPAGE

(75) Inventors: Seung Wook Park, Seoul-si (KR); Tae Woo Lee, Jun dong (KR); Hyun Jin Park, Sunngnam-si (KR)

(73) Assignee: Chippac, Inc., Fremont, CA (US)

( * ) Notice: Subject to any disclaimer, the term of this patent is extended or adjusted under 35 U.S.C. 154(b) by 0 days.

(21) Appl. No.: 11/252,990

(22) Filed: Oct. 18, 2005

(65) Prior Publication Data

US 2006/0094208 A1 May 4, 2006

Related U.S. Application Data

(60) Provisional application No. 60/620,750, filed on Oct. 21, 2004.

(51) Int. Cl.
*H01L 21/00* (2006.01)

(52) U.S. Cl. .................. 438/460; 438/33; 438/113; 438/457; 438/458; 257/E21.484; 257/E21.596; 257/E21.599

(58) Field of Classification Search .............. 438/33, 438/459, 460, 457, 68, 113, 114, 458; 257/E21.37, 257/E21.484, E21.596, E21.599, E21.237
See application file for complete search history.

(56) References Cited

U.S. PATENT DOCUMENTS

| 6,426,275 | B1 * | 7/2002 | Arisa | .......................... 438/464 |
| 7,081,678 | B2 | 7/2006 | Liu | |
| 7,115,484 | B2 | 10/2006 | Feng | |
| 2002/0055238 | A1 * | 5/2002 | Sugino et al. | .............. 438/459 |

* cited by examiner

*Primary Examiner*—Long K. Tran
(74) *Attorney, Agent, or Firm*—Haynes Beffel & Wolfeld LLP

(57) ABSTRACT

An anti-warpage backgrinding tape (11) is secured to the circuit side (12) of a semiconductor wafer (14). The backside (16) of the wafer is background. The backside of the wafer is secured to dicing tape (18) so that the anti-warpage backgrinding tape is exposed. The wafer is diced to create individual die structure (34). The die structure comprises semiconductor die (22) with anti-warpage tape elements (36) on circuit sides of the semiconductor die. A die structure is removed from the dicing tape. The backside of the die of the die structure is adhered to a substrate (24). The anti-warpage tape element is removed from the die. The anti-warpage backgrinding tape is preferably partially or fully transparent to permit sensing of guide markings on the wafer during wafer dicing. The adhesive is preferably a curable adhesive. The adhesion between the anti-warpage tape element and the chosen die may be reduced by the application of heat (38).

14 Claims, 2 Drawing Sheets

METHOD FOR REDUCING SEMICONDUCTOR DIE WARPAGE

CROSS-REFERENCE TO RELATED APPLICATIONS

This application claims priority from U.S. Provisional Application No. 60/620,750, filed Oct. 21, 2004, titled "Method for reducing semiconductor die warpage".

BACKGROUND

The present invention relates to methods for reducing warpage of semiconductor die.

Semiconductor wafer thinning technology is important to package development. Current wafer thinning methods include the in-line wafer B/G (BackGrinding) system and the DBG (Dicing Before Grinding) process. Wafer B/G systems have used a film adhesive process in which the wafer is thinned by backgrinding and then is diced (that is, the semiconductor wafer is separated into individual semiconductor die), typically using a laser or a dicing saw. The laser or dicing saw follows markings on the circuit side of the wafer. Before dicing, a wafer mounting tape, also called dicing tape, is typically attached to the backside of the wafer. The dicing tape keeps the die in place after dicing. With the DBG process, the wafer is diced before backgrinding.

The semiconductor die is typically mounted onto a mounting surface of a substrate or of a previously mounted die and is adhered to the die or to the substrate with a paste (typically an epoxy paste adhesive) or a film adhesive. Generally, paste adhesives have been used more often than film adhesives.

After the chip mounting process, bonding pads of the chips are connected to bonding pads of the substrate, and/or bonding pads of the underlying previously mounted die, with Au or Al wires during a wire bonding process to create an array of semiconductor chip devices. Finally, the semiconductor chips and their associated wires connected to the substrate are encapsulated, typically using an epoxy-molding compound, to create an array of encapsulated semiconductor devices. The molding compound protects the semiconductor devices from the external environment, such as physical shock and humidity. After encapsulation, the encapsulated devices are separated (singulated), typically using a laser or a saw, into individual semiconductor chip packages.

To obtain the maximum function and efficiency from the minimum package, various types of increased density packages have been developed. Among these various types of packages is the multiple-die semiconductor chip package, commonly referred to as a multi-chip module, multi-chip package or stacked chip package. A multi-chip module includes one or more integrated circuit semiconductor chips, often referred to as circuit die, stacked one onto another to provide the advantages of light weight, high density, and enhanced electrical performance. In addition, reducing the thickness of semiconductor die also helps to increase the package density. However, reducing the thickness of semiconductor wafers, and thus the thickness of the resulting semiconductor die, can create warpage problems for both the wafer and the die. While further backside treatment processes, such as wet etch, CMP, and dry polishing, can help, typically not all the warpage in the wafer can be removed, and this warpage can result in problems relating to nonuniform bond line thickness (BLT) during the die attach process.

SUMMARY

The invention is directed to a method for reducing semiconductor die warpage. An anti-warpage backgrinding tape is secured to the circuit side of a semiconductor wafer. The backside of the wafer is background. The backside of the wafer is secured to dicing tape so that the anti-warpage backgrinding tape is exposed. The wafer is diced by creating an array of grooves through the anti-warpage backgrinding tape and through the wafer to create individual die structures. The die structures comprise semiconductor die with anti-warpage tape elements on circuit sides of the semiconductor die, the circuit sides of the semiconductor die corresponding to the circuit side of the wafer. A chosen die structure is removed from the dicing tape. The backside of the chosen die of the chosen die structure is mounted onto the mounting surface of a substrate or of a previously mounted die, the backside of the chosen die corresponding to the backside of the wafer. The anti-warpage tape element is then removed from the chosen die.

In some embodiments of the invention a partially or fully transparent anti-warpage backgrinding tape may be used to permit sensing of guide markings on the circuit side of the semiconductor wafer during dicing of the wafer. The adhesive is preferably a curable adhesive. The adhesion between the anti-warpage tape element and the chosen die may be reduced by, for example, the application of heat.

Various features and advantages of the invention will appear from the following description in which the preferred embodiments have been set forth in detail in conjunction with the accompanying drawings.

BRIEF DESCRIPTION OF THE DRAWINGS

FIG. 10 shows forming an array of grooves in the wafer and anti-warpage backgrinding tape structure of FIG. 9 thereby dicing the wafer and tape structure to create individual die structures;

FIG. 11 shows a die structure of FIG. 10 after having been removed from the dicing tape of FIG. 10 using a pickup tool and after having been adhered to a substrate using an adhesive;

FIG. 12 illustrates the application of heat to cure the adhesive and to reduce the adhesive strength between the anti-warpage tape element and the die;

FIG. 13 illustrates removal of the anti-warpage tape element from the die of FIG. 12; and FIG. 14 illustrates the resulting semiconductor subassembly including a chip adhered to a substrate by an adhesive.

DETAILED DESCRIPTION

The invention will now be described in further detail by reference to the drawings, which illustrate a preferred embodiment of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1:
FIG. 1 shows lamination of a backgrinding tape to the circuit side of a semiconductor wafer.
Figure 2:
FIG. 2 shows backgrinding of the backside of the semiconductor wafer of FIG. 1.
Figure 3:
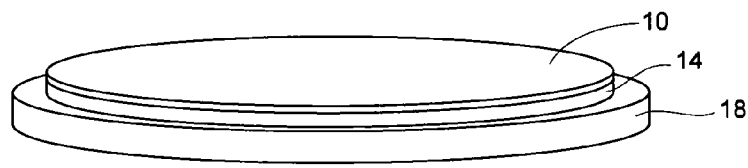
FIG. 3 illustrates the ground backside of the wafer of FIG. 2 secured to a dicing tape.
Figure 4:
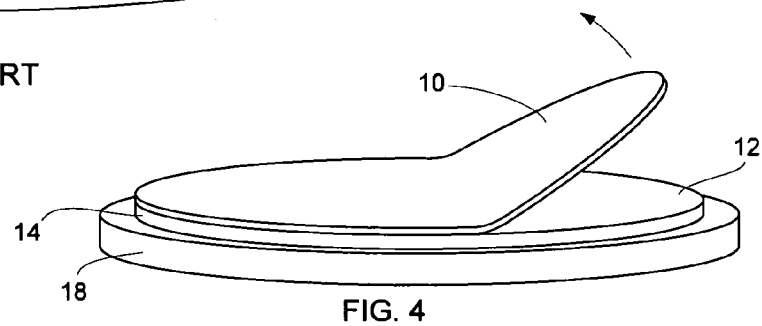
FIG. 4 shows the removal of the backgrinding tape from the circuit side of the semiconductor wafer of FIG. 3.
Figure 5:
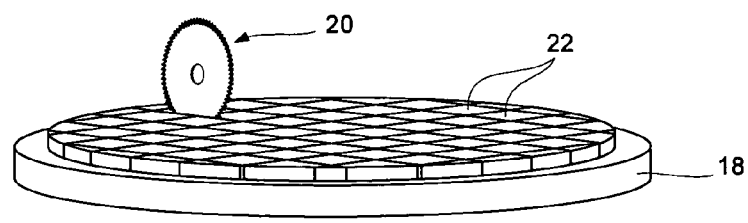
FIG. 5 illustrates dicing the semiconductor wafer of FIG. 4.
Figure 6:
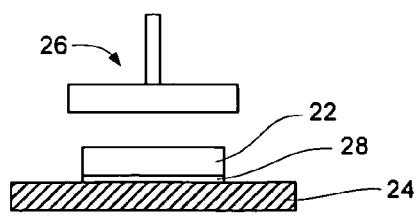
FIG. 6 suggests attaching a die of FIG. 5 to a substrate using a pickup tool and securing it to the substrate using a paste adhesive, FIGS. 1-6 being conventional.

FIGS. 1-6 illustrate a conventional method for dicing a semiconductor wafer and attaching the resulting die to a substrate. FIG. 1 shows lamination of a backgrinding tape 10 to first, circuit side 12 of a semiconductor wafer 14. The second, backside 16 of wafer 14 is thinned by backgrinding as shown in FIG. 2. FIG. 3 illustrates the ground backside 16 of wafer 14 secured to a dicing tape 18. FIG. 4 shows the removal of backgrinding tape 10 from the circuit side 12 of semiconductor wafer 14. A dicing saw 20 is used to dice semiconductor wafer 14 to create individual semiconductor die 22 as shown in FIG. 5. In FIG. 6 a die 22 is removed from dicing tape 18 and adhered to a substrate 24 through the use of a pickup tool 26 and a paste adhesive 28. Die 22 could alternatively be adhered to a previously placed semiconductor die supported by substrate 24; in such case the previously placed semiconductor die would also act as a substrate for die adhering purposes.

The semiconductor wafer (and a die made from it) has an intrinsic tendency to warp, to a degree that depends upon its thickness and upon the electronic structures that are formed within and upon the silicon wafer. Additionally, because the various layers on and in the semiconductor wafer include materials having different thermal expansion characteristics, the tendency to warp may vary according to variations in temperature during processing. According to the invention, a backgrinding tape is selected to counter the tendency of the particular wafer (or die) to warp.

Figure 7:
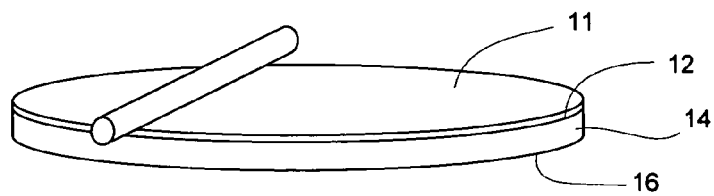
FIGS. 7-14 are directed to the present invention with FIGS. 7-9 being similar to FIGS. 1-3 except for the use of anti-warpage backgrinding tape instead of the backgrinding tape of FIGS. 1-3.
Figure 8:
Figure 9:

FIGS. 7-14 are directed to the present invention. FIGS. 7-9 are similar to FIGS. 1-3 except that an anti-warpage backgrinding tape 11 is employed in place of the backgrinding tape 10 of FIGS. 1-3. For purposes of description, antiwarpage backgrinding tape 11 and wafer 14 together constitute a wafer and tape structure 32. Typically the active (circuit) side of the wafer includes a passivation layer, which covers the active circuitry except for the bond pads, which are left exposed. The passivation layer is a layer of a dielectric material (such as glass or plastic) which may be formed, for example, by spin-coating or by deposition, as for example by vapor deposition (e.g., CVD or PVD). In such a case the antiwarpage backgrinding tape 11 covers the passivation layer as well as the bonding pads.

Figure 10:
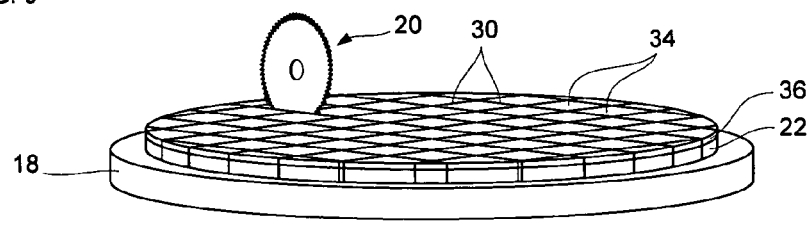

FIG. 10 shows a dicing saw 20 forming an array of grooves 30 in wafer 14 and in anti-warpage backgrinding tape 11 thereby dicing the wafer and tape structure 32 of FIG. 9 to create individual die structures 34. Each die structure 34 includes a semiconductor die 22 and an anti-warpage tape element 36. Anti-warpage backgrinding tape 11 may be the same as or similar to conventional backgrinding tape; it preferably has one or more characteristics that may not be found in or be important for a conventional backgrinding tape 10. One characteristic is that anti-warpage backgrinding tape 11 is sufficiently transparent so that image marks on first, circuit side 12 of wafer 14 are discernible during the dicing process. The image marks may be discernible in different ways, including using visible light, infrared light, laser light, other electromagnetic radiation, and non-radiation detection techniques. As used in this application, the term transparent is intended to cover situations in which the material is optically or otherwise transparent and also when the material is optically or otherwise translucent. Another characteristic of the antiwarpage backgrinding tape according to the invention is that the adhesive is such that the bond strength between tape element 36 and die 22 can be selectively reduced, for ready removal during processing.

Figure 11:
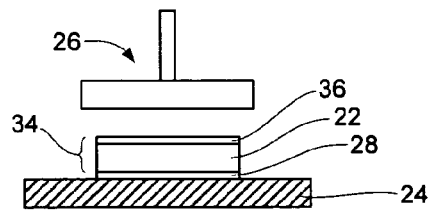
Figure 12:
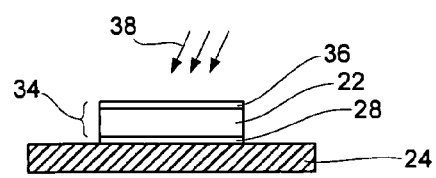

After dicing, die structure 34 is removed from dicing tape 18 by a pickup tool 26 as suggested in FIG. 11. Pickup tool 26 places die structure 34 onto a mounting surface of a substrate 24, or of a previously mounted die, so that die structure 34 is adhered to the mounting surface 24 by a paste adhesive 28, or by another suitable adhesive such as a film adhesive. FIG. 12 illustrates the application of heat 38 both to cure adhesive 28 and to reduce the adhesive strength between the anti-warpage tape element 36 and die 22. Alternatively, anti-warpage tape 11 may be of a thermal release type so that the adhesion strength between tape element 36 and die 22 is temporarily reduced when subjected to an elevated temperature. Other conventional or nonconventional methods for curing adhesive 28 and/or reducing the adhesive strength between anti-warpage tape element 36 and die 22, such as the application of UV or both UV and heat, may be used.

Figure 13:
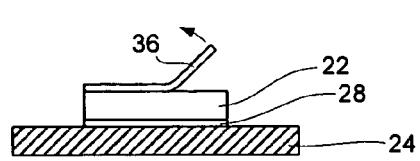
Figure 14:
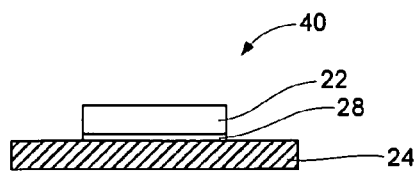

FIG. 13 illustrates removal of anti-warpage tape element 36 from die 22. This can be accomplished using conventional equipment. FIG. 14 illustrates the resulting semiconductor subassembly 40 including chip 22 adhered to the mounting surface of a substrate 24 by adhesive 28.

Anti-warpage backgrinding tape 11 may be similar to those available from Nitto Denko of Osaka, Japan under the name "Revalpa", and others. Tape 11 preferably has at least the following characteristics: sufficiently optically or otherwise transparent to permit imaging marks on wafer 14 to be sensed or discernible by the dicing mechanism; provide sufficient structural integrity to die 22 to help prevent warpage of the die; be adhesively secured to die 22 so to permit the adhesive strength between tape 11 and die 22 to be substantially reduced to facilitate removal of tape 11 from die 22 after die 22 has been adhered to substrate 24. The anti-warpage backgrinding tape may be a multi-layer (for example, two-layer) tape, the layers being selected to contribute to the various properties of the tape. The use of anti-warpage backgrinding tape 11 and the resulting anti-warpage tape elements 36 can also help reduce wafer breakage, help prevent contamination of the circuit side by silicon dust, help reduce contamination of the die by epoxy, help improve die attach workability and package reliability, help protect the passivation layer on the circuit side of the die, and help prevent corrosion of bonding pads on circuit side 12 of die 22 during, for example, a thermal cure cycle.

Other modification and variation can be made to the disclosed embodiments without departing from the subject of the invention as defined in following claims.

Any and all patents, patent applications and printed publications referred to above are incorporated by reference.

Other embodiments are within the scope of the invention.

What is claimed is:

1. A method for reducing semiconductor die warpage comprising:

securing an anti-warpage backgrinding tape to a first side of a semiconductor wafer;

backgrinding a second side of the wafer;

securing the second side of the wafer to dicing tape so that the anti-warpage backgrinding tape is exposed;

forming an array of grooves through the anti-warpage backgrinding tape and through the wafer to create individual die structure comprising semiconductor die with anti-warpage tape elements on first sides of the semiconductor die, the first sides of the semiconductor die corresponding to the first side of the wafer;

removing a chosen die structure from the dicing tape;

adhering a second side of a chosen die of the chosen die structure to a substrate, the second side of the chosen die corresponding to the second side of the wafer; and removing the anti-warpage tape element from the adhered die.

2. The method according to claim 1 further comprising selecting an at least partially transparent anti-warpage backgrinding tape to permit sensing of guide markings on the first side of the semiconductor wafer during the array of grooves forming step.

3. The method according to claim 2 wherein the at least partially transparent anti-warpage backgrinding tape is at least partially transparent to visible light.

4. The method according to claim 1 wherein the adhering step is carried out using an adhesive.

5. The method according to claim 4 wherein the adhering step is carried out using at least one of a film adhesive and a paste adhesive.

6. The method according to claim 4 wherein the adhering step comprises curing the adhesive.

7. The method according to claim 6 wherein the curing step comprises application of heat.

8. The method according to claim 1 further comprising reducing adhesion between the anti-warpage tape element and the chosen die.

9. The method according to claim 8 wherein the adhesion reducing step is carried out by the application of heat.

10. The method according to claim 8 wherein the adhering step comprises curing the adhesive.

11. The method according to claim 10 wherein the curing step comprises application of heat.

12. The method according to claim 11 wherein the adhesion reducing step is carried out by the application of heat during the curing step.

13. A method for reducing semiconductor die warpage comprising:

selecting an at least partially transparent anti-warpage backgrinding tape;

securing the anti-warpage backgrinding tape to a first side of a semiconductor wafer;

backgrinding a second side of the wafer;

securing the second side of the wafer to dicing tape so that the anti-warpage backgrinding tape is exposed;

forming an array of grooves through the anti-warpage backgrinding tape and through the wafer to create individual die structure comprising semiconductor die with anti-warpage tape elements on first sides of the semiconductor die, the first sides of the semiconductor die corresponding to the first side of the wafer;

the selecting step being carried out to permit sensing of guide markings on the first side of the semiconductor wafer during the array of grooves forming step;

removing a chosen die structure from the dicing tape;

adhering a second side of a chosen die of the chosen die structure to a substrate using an adhesive, the second side of the chosen die corresponding to the second side of the wafer;

reducing adhesion between the anti-warpage tape element and the chosen die; and removing the anti-warpage tape element from the chosen die.

14. The method according to claim 13 wherein:

the adhering step comprises curing the adhesive using heat; and the adhesion reducing step is carried out by the application of heat during the curing step.

* * * * *